US008771922B2

(12) United States Patent
Shin et al.

(10) Patent No.: US 8,771,922 B2
(45) Date of Patent: Jul. 8, 2014

(54) COPOLYMER FOR RESIST COMPRISING NOVEL ACRYL BASED MONOMER AND RESIN COMPOSITION FOR RESIST COMPRISING THE SAME

(75) Inventors: Jin Bong Shin, Chungcheongnam-do (KR); Jin Ho Kim, Chungcheongnam-do (KR); Dae Hyeon Shin, Seoul (KR); Seung Jae Lee, Chungcheongnam-do (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 0 days.

(21) Appl. No.: 13/432,218

(22) Filed: Mar. 28, 2012

(65) Prior Publication Data
US 2012/0251952 A1 Oct. 4, 2012

(30) Foreign Application Priority Data

Mar. 30, 2011 (KR) .................. 10-2011-0028951

(51) Int. Cl.
G03F 7/00 (2006.01)
C08F 236/20 (2006.01)
C08F 118/02 (2006.01)

(52) U.S. Cl.
USPC .................... 430/270.1; 526/282; 526/319

(58) Field of Classification Search
None
See application file for complete search history.

(56) References Cited

U.S. PATENT DOCUMENTS

2009/0264565 A1* 10/2009 Fuji et al. ................ 524/165

FOREIGN PATENT DOCUMENTS

KR 20110037170 * 4/2011

OTHER PUBLICATIONS

Machine translation KR 2011-0037170. Apr. 13, 2011.*

* cited by examiner

*Primary Examiner* — Cynthia H Kelly
*Assistant Examiner* — Alyssa L Cepluch
(74) *Attorney, Agent, or Firm* — Ladas & Parry LLP

(57) ABSTRACT

A resist resin composition includes 100 parts by weight of a copolymer represented by Formula 3 below; 0.5 to 1.5 parts by weight of a photoacid generator and 700 to 1,500 parts by weight of a solvent:

<Formula 3>

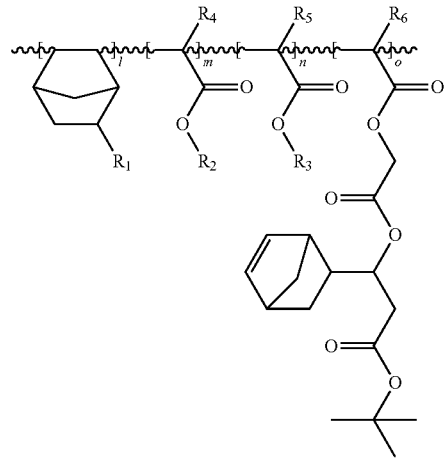

wherein $R_1$, $R_2$, and $R_3$ are each independently a $C_{1-30}$ alkyl group, a $C_{3-30}$ cycloalkyl group, an ether group, an ester group, a carbonyl group, an acetal group, an epoxy group, a nitrile group, or an aldehyde group, $R_4$, $R_5$, and $R_6$ are each independently hydrogen or a methyl group, and l, m, n, and o each independently refer to the number of repeating units in a main backbone and satisfy the conditions: $l+m+n+o=1$, $0 \leq l/(l+m+n+o)<0.4$, $0<m/(l+m+n+o)<0.6$, $0 \leq n/(l+m+n+o)<0.6$, and $0<o/(l+m+n+o)<0.4$.

18 Claims, No Drawings

COPOLYMER FOR RESIST COMPRISING NOVEL ACRYL BASED MONOMER AND RESIN COMPOSITION FOR RESIST COMPRISING THE SAME

CROSS-REFERENCE TO RELATED PATENT APPLICATION

This application claims the benefit of Korean Patent Application No. 10-2011-0028951, filed on Mar. 30, 2011, in the Korean Intellectual Property Office, the disclosure of which is incorporated herein in its entirety by reference.

BACKGROUND OF THE INVENTION

1. Field of the Invention

An aspect of the present invention relates to a resist resin composition that is used in a semiconductor process, and more particularly, to a photoresist composition capable of increasing contrast and resolution in a photoresist patterning process.

2. Description of the Related Art

Recently, with a trend of high integration of semiconductor devices, demands for an ultra-fine pattern of 0.10 μm or less in manufacturing an ultra-large scale integrated (ULSI) circuit are increased. Accordingly, a light source with a shorter wavelength than that of conventional g-rays or i-rays is needed in a light exposure process. For example, a study for lithography using far ultraviolet rays, a KrF excimer laser, an ArF excimer laser, extreme ultraviolet radiation (EUV), X-rays, and electron beams is gaining attention. In particular, a light source gaining most attention in a next generation lithography which requires a pattern of 0.10 μm or less may be the ArF excimer laser.

In general, a photoresist composition include a component having an acid-labile functional group (e.g., polymer), a component that generates acid by irradiation with radiation rays (e.g., acid generator), and a solvent, and further include a basic additive if needed.

The polymer which is used as a main material of the photoresist is required to include functional groups that appropriately interacts with a developing solution and has appropriate adhesion strength with a substrate, an etching resistance, and high resolution.

Examples of the functional group that appropriately interacts with a developing solution and has appropriate adhesion strength with a substrate include a hydroxyl group, a lactone group, and a carboxyl group. Examples of the functional group that improves an etching resistance include derivatives having a cyclic alkyl group that does not have an oxygen atom in its main backbone, such as norbornene derivatives and adamantane derivatives. To increase resolution, however, research into a method of increasing the mobility of acid by using these functional groups, by a structure of the polymer, and by using a photoacid generator has been conducted. Therefore, to increase high-end resolution and line edge roughness, there is a need to develop a novel monomer for preparing a high-quality polymer.

SUMMARY OF THE INVENTION

The present invention provides a polymer that is used as a chemically amplified photoresist having photosensitivity to a KrF excimer laser, an ArF excimer laser, EUV, X-rays, or e-Beam, is less dependent on a substrate, has excellent transparency in a wavelength region corresponding to above excimer laser, and is used to form a photoresist pattern with high contrast, high sensitivity, high resolution, and excellent developing properties.

The present invention also provides a resist resin composition including the polymer.

According to an aspect of the present invention, there is provided a copolymer for a resist, including as repeating units a norbornene derivative and at least one of the acryl-based monomers represented by Formulae 1 and 2 below, wherein the at least one monomer is combined to a side chain thereof:

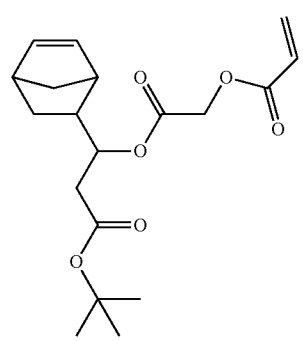

<Formula 1>

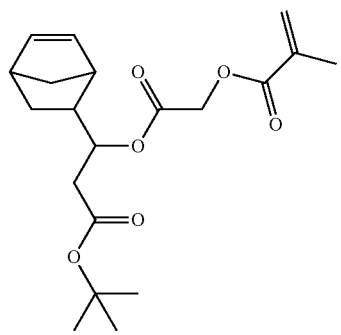

<Formula 2>

According to another aspect of the present invention, there is provided a resist resin composition including 100 parts by weight of a copolymer represented by Formula 3 below; 0.5 to 15 parts by weight of a photoacid generator; and 700 to 1,500 parts by weight of a solvent:

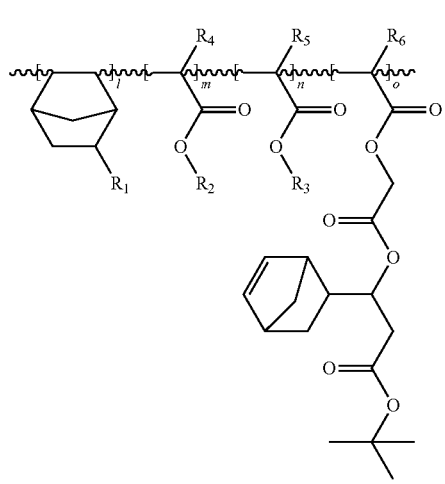

<Formula 3> wherein $R_1$, $R_2$, and $R_3$ are each independently a $C_{1-30}$ alkyl group, a $C_{3-30}$ cycloalkyl group, an ether group, an ester group, a carbonyl group, an acetal group, an epoxy group, a nitrile group, or an aldehyde group, $R_4$, $R_5$, and $R_6$ are each independently hydrogen or a methyl group, and l, m, n, and o each independently refer to the number of repeating units in a main backbone and satisfy the conditions: $l+m+n+o=1$, $0 \le l/(l+m+n+o)<0.4$, $0<m/(l+m+n+o)<0.6$, $0 \le n/(l+m+n+o)<0.6$, and $0<o/(l+m+n+o)<0.4$.

According to another aspect of the present invention, there is provided a photoresist film formed by coating and curing the copolymer described above.

DETAILED DESCRIPTION OF THE INVENTION

One or more embodiments of a copolymer for resist and a resist resin composition including the copolymer will now be described in detail. However, the embodiments are for illustrative purposes only and are not intended to limit the scope of the invention. Expressions such as "at least one of," when preceding a list of elements, modify the entire list of elements and do not modify the individual elements of the list.

According to an embodiment of the present invention, a resist resin composition includes a copolymer, a photoacid generator, and a solvent.

Synthesis of Acryl-Based Monomer

A monomer used to form a copolymer for resist may be at least one of a monomer represented by Formula 1 below and a monomer represented by Formula 2 below:

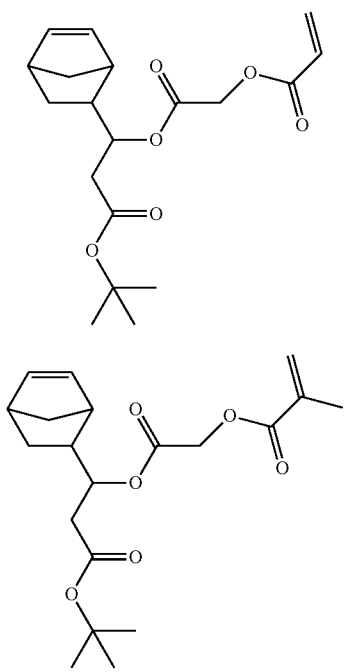

SYNTHESIS EXAMPLE

Synthesis Example 1

First Process 100 g of 3-bicyclo[2.2.1]hept-5-en-2-yl-3-hydroxy-propionic acid tert-butyl ester ("BHP") was dissolved in 1 L of methylene chloride, 36.51 g of pyridine was added to the mixture at 0° C., bromoacetyl bromide was slowly added thereto, and the resultant mixture was stirred at room temperature for 2 hours. The reaction product was dissolved again in methylene chloride, washed with acid and distilled water, only an organic layer was separated therefrom, and a solvent was removed from the organic layer to obtain 165 g of a monomer represented by Formula 4 below as an intermediate product. The monomer of Formula 4 was prepared according to Reaction Scheme 1 below.

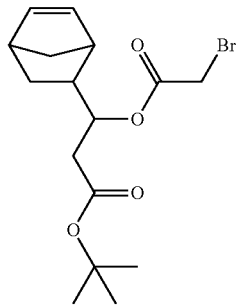

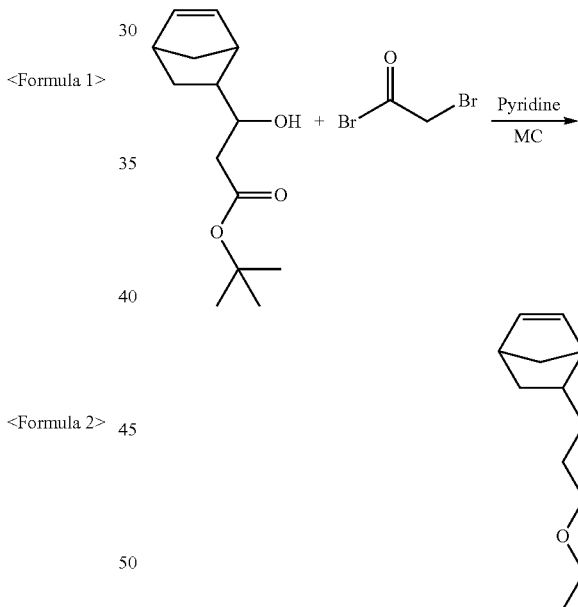

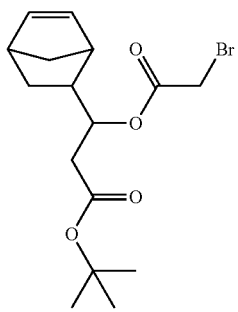

$^1$H-NMR: (ppm) 0.6 (d, 1H), 1.22 (d, 2H), 1.42 (s, 12H), 1.8 (m, 1H), 2.2 (m, 3H), 2.88 (d, 2H), 3.78 (s, 2H), 4.7 (m, 1H), 5.9 (s, 1H), 6.22 (s, 1H)

Second Process 60 g of the monomer of Formula 4, 14.38 g of methacrylic acid, and 0.05 g of Inorganox1010 were dissolved in 500 ml of acetone in a 2-neck round bottom flask equipped with an agitator, a solution obtained by dissolving 18.59 g of triethyl amine in 50 ml of acetone was then slowly added thereto at 0° C., and the resultant solution was stirred at room temperature for approximately 12 hours. The stirred solution was treated with acid and washed with distilled water, only an organic layer was then separated therefrom, and a solvent was completely removed from the organic layer to obtain 53 g of 2-methyl-acrylic acid 1-bicyclo[2.2.1]hept-5-en-2-yl-2-tert-butoxycarbonyl-ethoxycarbonylmethyl ester ("BHP-2") represented by Formula 1.

$^1$H-NMR: (ppm) 0.6 (d, 1H), 1.22 (d, 2H), 1.42 (s, 12H), 1.8 (m, 1H), 2.05 (s, 3H), 2.3~2.5 (m, 3H), 2.88 (d, 2H), 4.7 (m, 3H), 5.65 (s, 1H), 5.9 (s, 1H), 6.2 (s, 1H), 6.24 (s, 1H)

Synthesis of Copolymer for Resist

According to an embodiment of the present invention, a copolymer is represented by Formula 3 below:

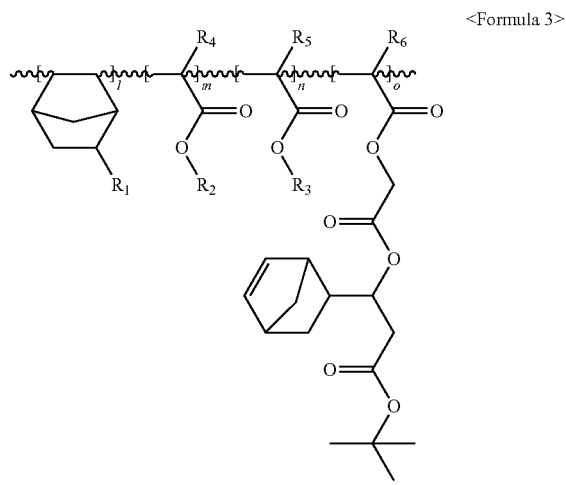

<Formula 3> wherein $R_1$, $R_2$, and $R_3$ are each independently a $C_{1-30}$ alkyl group, $C_{3-30}$ cycloalkyl group, an ether group, an ester group, a carbonyl group, an acetal group, an epoxy group, a nitrile group, or an aldehyde group, $R_4$, $R_5$, and $R_6$ are each independently hydrogen or a methyl group, and l, m, n, and o each independently refer to the number of repeating units in a main backbone and satisfy the conditions: l+m+n+o=1, 0≤l/(l+m+n+o)<0.4, 0<m/(l+m+n+o)<0.6, 0≤n/(l+m+n+o)<0.6, and 0<o/(l+m+n+o)<0.4.

The copolymer has acrylate derivatives of BHP-2, acrylate monomers that are different therefrom, and a norbornene derivative as repeating units. The copolymer may be insoluble or poorly soluble with respect to an aqueous alkali solution, but may be soluble with respect thereto in a certain case. Also, the copolymer may have an acid-labile functional group at its side chain.

The copolymer has a solubility that varies according to types and amounts of the monomers in the copolymer. For example, as the number of hydrophobic groups of the copolymer increases, the solubility of the copolymer with respect to an aqueous alkali solution decreases. When the copolymer obtained by adjusting the types and amounts of the monomers is used to prepare a photoresist composition, a photoresist composition with good adhesion strength with a substrate, substrate-independent properties, high sensitivity, and high resolution may be obtained.

In Formula 3 above, norbornene groups of a norbornene derivative represented by a repeating unit. "l" have properties that induce a structure of the copolymer to a modified spiral structure, and thus the copolymer may have significantly increased solubility, as compared to that of a conventional methacryl copolymer. In addition, if only acryl-based monomers are used to form a polymer, it is difficult to adjust the molecular weight of a copolymer and to form a polymer with a low molecular weight. When the norbornene derivative in Formula 3 is used in a polymerization reaction, however, a polymer with a low molecular weight may be formed by adjusting the polymerization degree of acryl-based monomers. That is, the norbornene derivative may act as a molecular weight modifier and increase an etching resistance.

In one embodiment, an acid-labile functional group and a moiety relating to an increase in adhesion on a wafer may be introduced into repeating units consisting of acrylate derivatives represented by repeating units "m" and "n". The moiety relating to an increase in adhesion on a wafer may be a lactone-containing acryl monomer.

In addition, a bulky hydrocarbon compound that increases a resistance to etching may be simultaneously introduced into the repeating units "m" and "n" together with the acid-labile functional group and a lactone functional group that increases adhesion strength with a substrate. In a repeating unit "o", t-butoxy carbonyl (t-BOC) may be introduced into norbornene (metha)acrylate, whereby a retention rate needed for an ArF immersion lithography process may increase, and when light is irradiated to the copolymer, a bond between an acid-labile functional group, i.e., t-BOC groups is broken so that the mobility of acid is increased and the copolymer may have high resolution, accordingly. Moreover, a pattern profile with good verticality due to contrast improvement effects may be obtained.

The copolymer may be a multiblock copolymer, a block copolymer, a random copolymer, or a graft copolymer. The copolymer of Formula 3 may be formed using a general polymerization method, in particular, a radical polymerization method. Examples of a radical polymerization initiator include azobisisobutyronitrile (AIBN), benzoyl peroxide (BPO), lauryl peroxide, azobisisocapronitrile, azobisisovaleronitrile, and t-butyl hydroperoxide. Examples of the polymerization method include bulk polymerization, solution polymerization, suspension polymerization, bulk-suspension polymerization, and emulsion polymerization. Examples of a polymerization solvent include benzene, toluene, xylene, halogenated benzene, diethyl ether, tetrahydrofuran, esters, ethers, lactones, ketones, amides, and alcohols. The polymerization solvents may be used alone or in combination of at least two of these materials.

A polymerization temperature of the copolymer of Formula 3 may be appropriately adjusted according to the type of a catalyst. A molecular weight distribution of the copolymer may be appropriately adjusted by varying the amount of a polymerization initiator and a reaction time. In addition, after the polymerization process is terminated, unreacted monomers and by-products remaining in a reaction mixture may be removed using precipitation by solvent.

A weight average molecular weight ("Mw") of the copolymer with respect to polystyrene standard by gel permeation chromatography (GPC) is generally in the range of 2,000 to 1,000,000, and may be in the range of 3,000 to 50,000 when sensitivity, developing properties, coating properties and thermal resistance of the copolymer as a photoresist are taken into consideration. The molecular weight distribution of the copolymer (weight average molecular weight/number average molecular weight) may be in the range of 1.0 to 5.0, in particular, in the range of 1.0 to 3.0.

Examples of the copolymer include, but are not limited to, copolymers represented by Formulae 5 to 18 below:

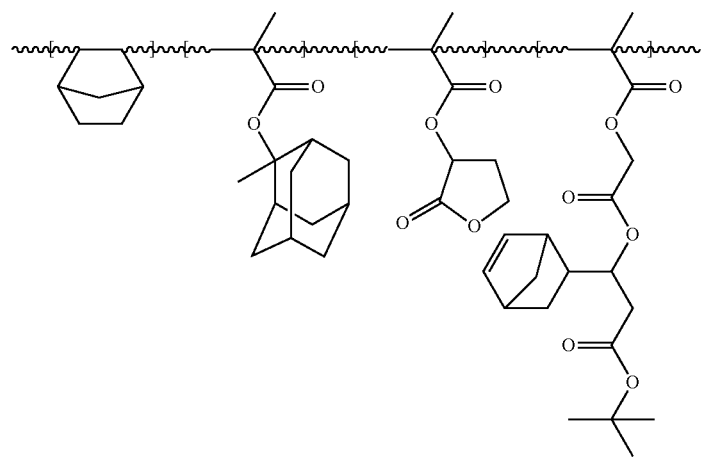
<Formula 5>
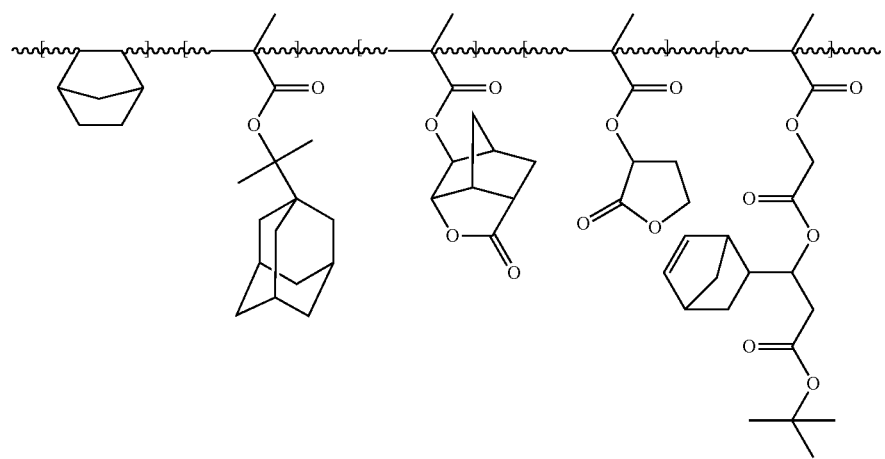
<Formula 6>
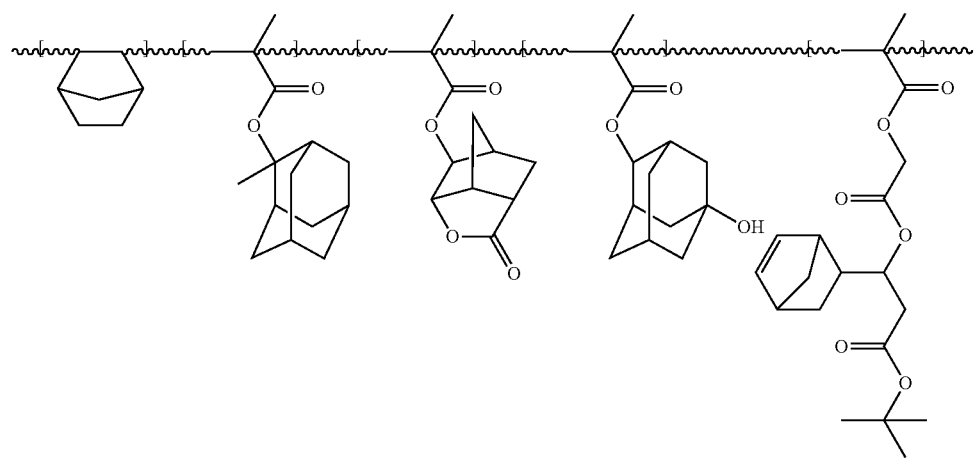
<Formula 7>

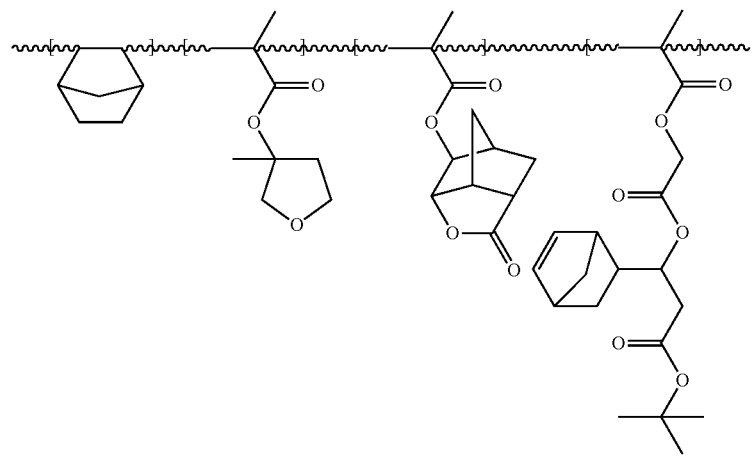
<Formula 8>
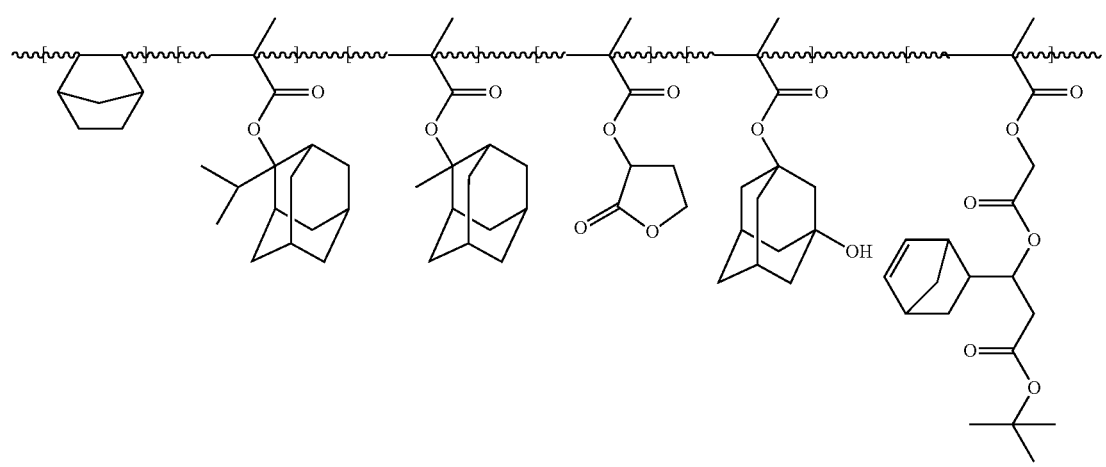
<Formula 9>
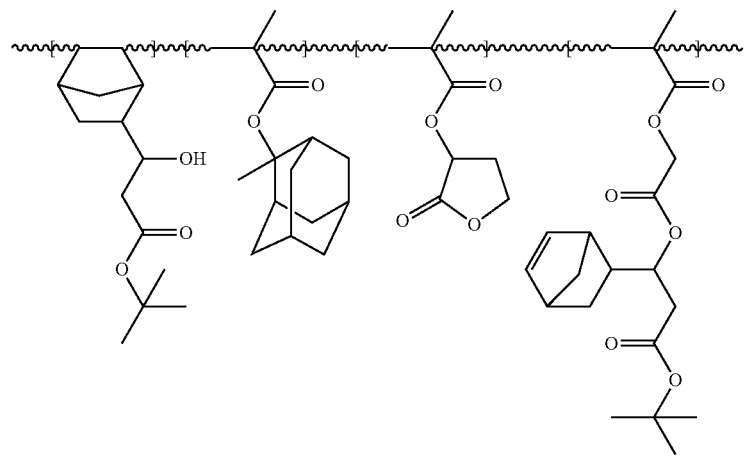
<Formula 10>

<Formula 11>
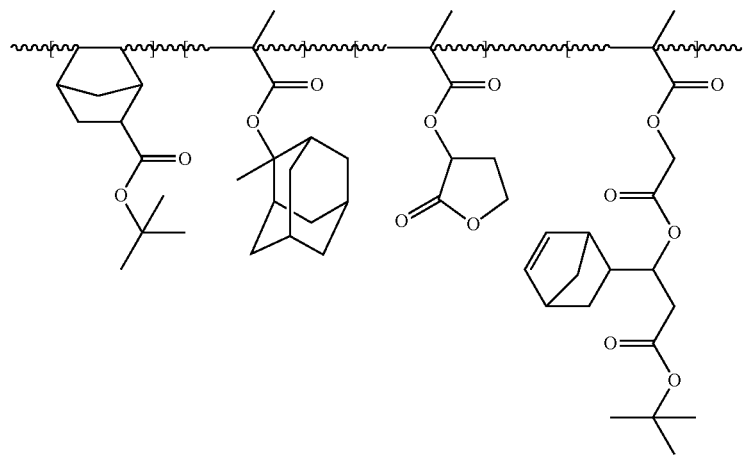
<Formula 12>
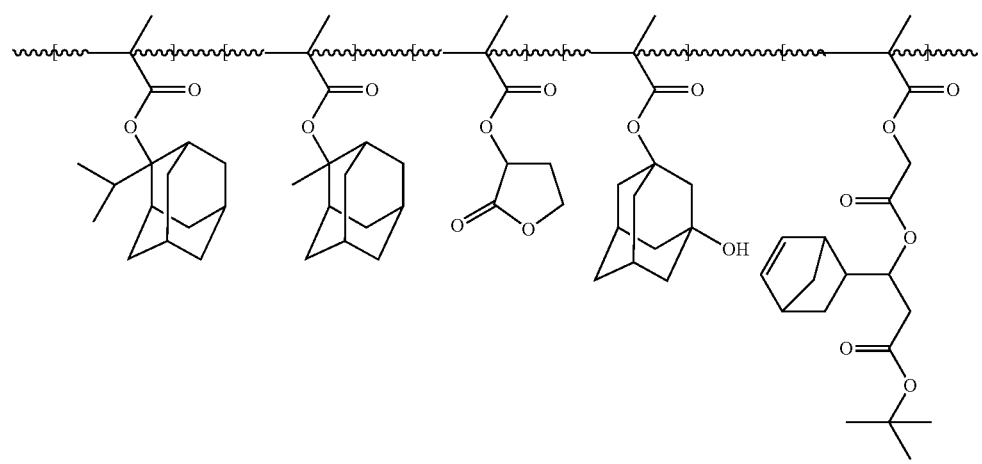
<Formula 13>
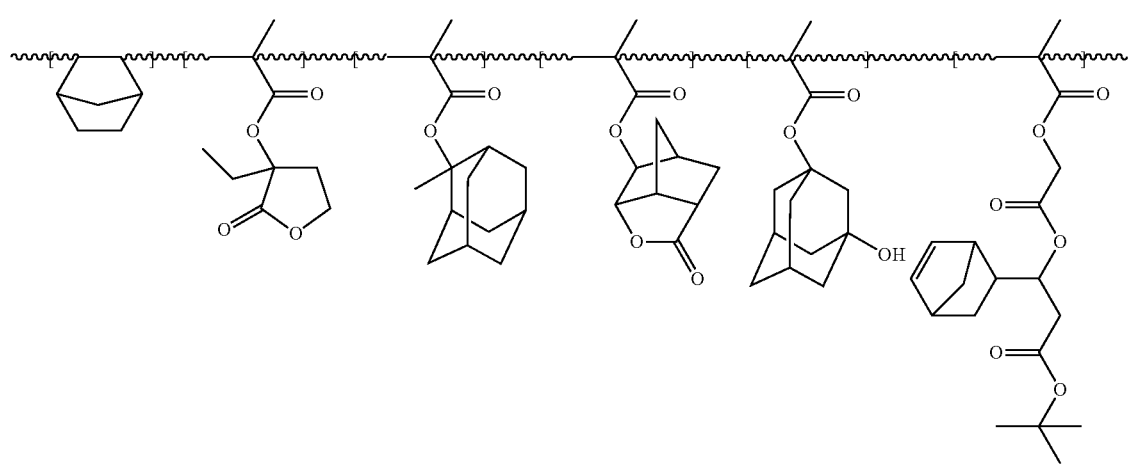

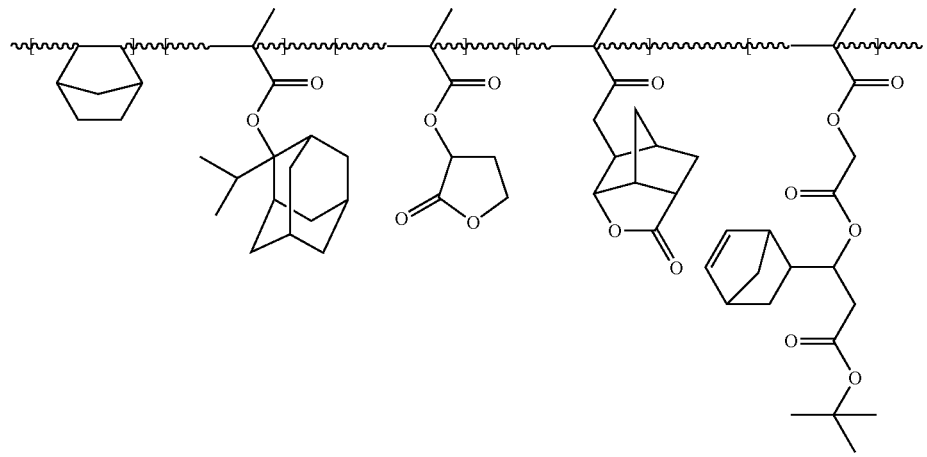
<Formula 14>
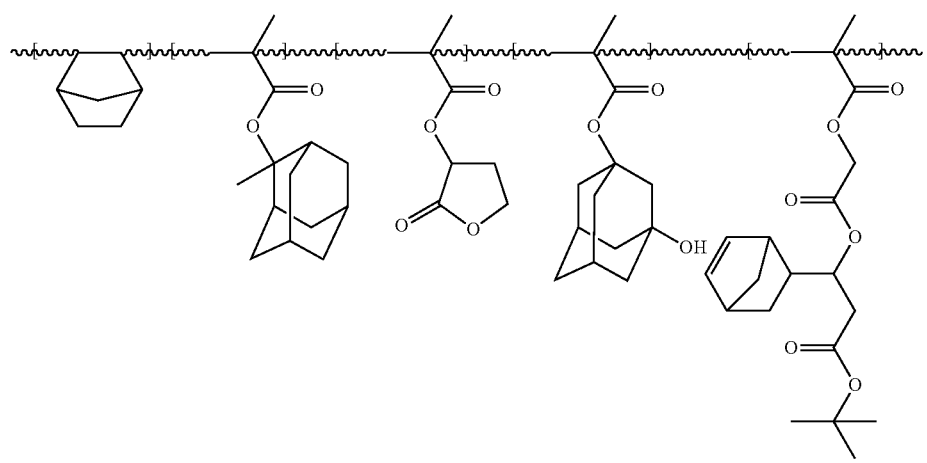
<Formula 15>
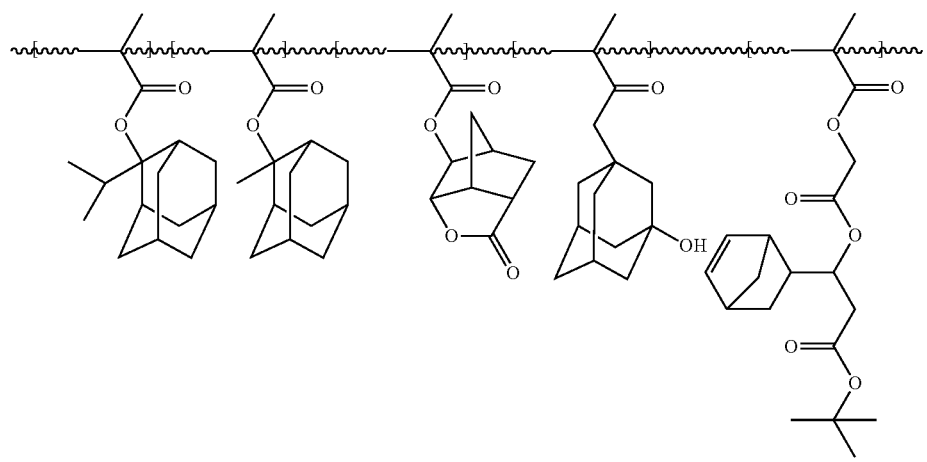
<Formula 16>

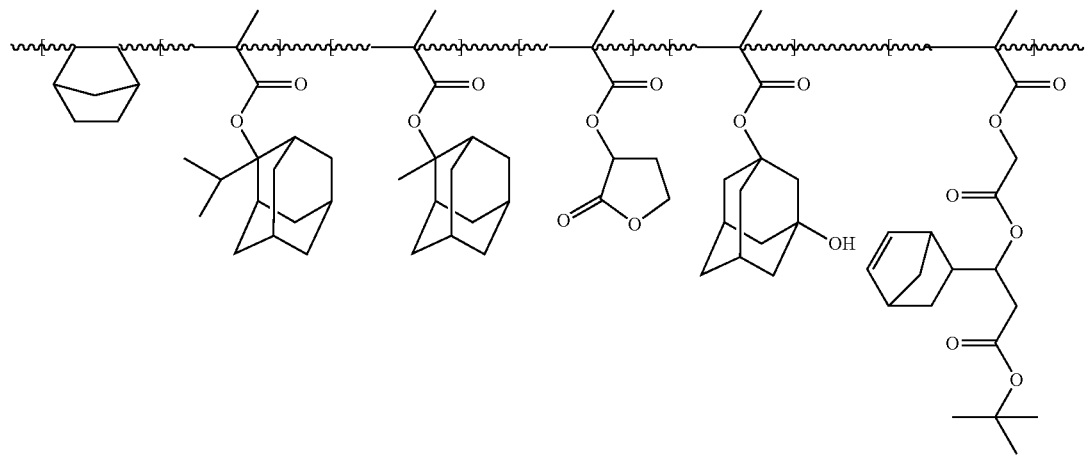

<Formula 17>

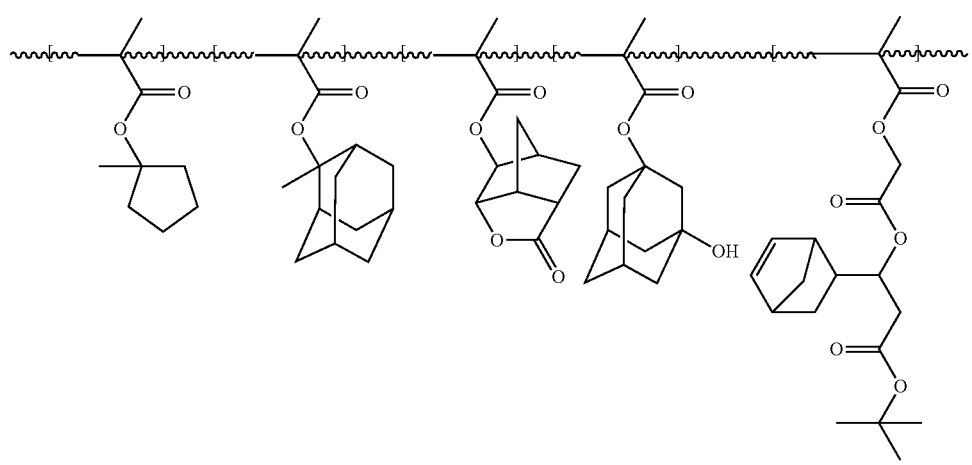

<Formula 18>

Photoacid Generator

As a photoacid generator, onium salt-based photoacid generators such as iodonium salts, sulfonium salts, phosphonium salts, diazonium salts, pyridinium salts, and imides may be used. Preferably, the photoacid generator may be a sulfonium salt represented by Formula 19 or 20 below. More preferably, by introducing a cyclic alkyl group into anions, a diffusion length of acid in a resist film may be appropriately maintained short and the resist film may have high permeability, whereby a resist with high resolution may be obtained.

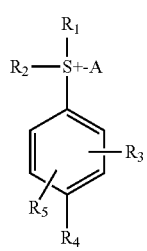

<Formula 19>

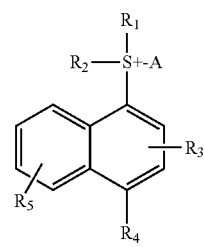

<Formula 20> wherein $R_1$ and $R_2$ are each independently an alkyl group, an allyl group, a perfluoroalkyl group, a benzyl group, or an aryl group, and $R_3$, $R_4$, and $R_5$ are each independently hydrogen, an alkyl group, a halogen group, a alkoxy group, an aryl group, a thiophenoxy group, a thioalkoxy group, or an alkoxycarbonylmethoxy group.

In Formulae 19 and 20, "A" which denotes an anion may be $OSO_2CF_3$, $OSO_2C_4F_9$, $OSO_2C_8F_{17}$, $N(CF_3)_2$, $N(C_2F_5)_2$, $N(C_4F_9)_2$, $C(CF_3)_3$, $C(C_2F_5)_3$, $C(C_4F_9)_3$, or a compound represented by Formula 21 below.

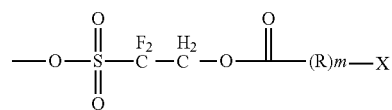

<Formula 21> wherein X refers to a monocyclic or polycyclic $C_3$-$C_{30}$ hydrocarbon group, a benzyl group, or an aryl group; a $C_1$-$C_{20}$ alkyl group, an allyl group, a perfluoroalkyl group, alkyl, haloalkyl, or an alkylsulfonyl group, wherein at least one hydrogen atom of the alkyl group is or is not substituted with an ether group, an ester group, a carbonyl group, an acetal group, a nitrile group, a cyano group, a hydroxy group, a carboxyl group, or an aldehyde group; or $C_1$-$C_4$ perfluoroalkyl group, R is a $C_1$-$C_{10}$ alkyl group, a $C_1$-$C_{10}$ alkoxy group, or a hetero atom selected from N, S, F, and O, and m is an integer of 0 to 2.

A group that denotes an anion in Formula 21 may be one of the anionic compounds represented by Formulae 22 through 57:

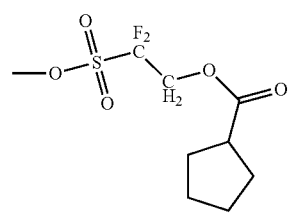

<Formula 22>

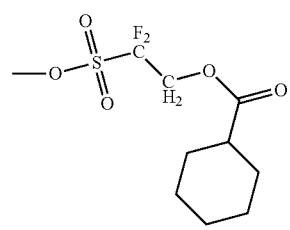

<Formula 23>

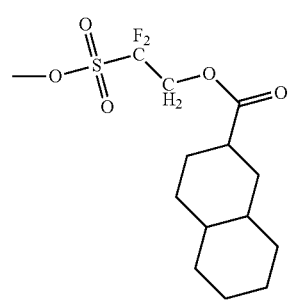

<Formula 24>

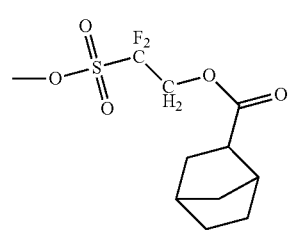

<Formula 25>

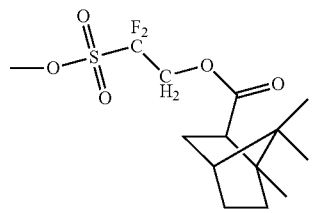

<Formula 26>

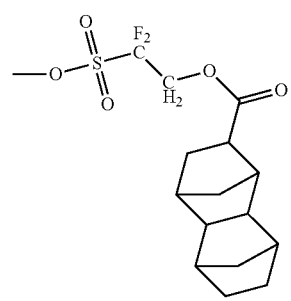

<Formula 27>

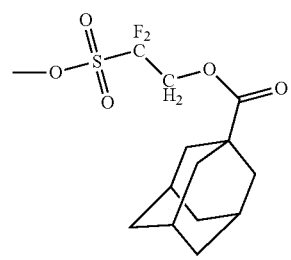

<Formula 28>

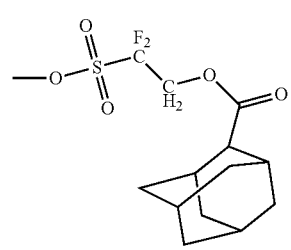

<Formula 29>

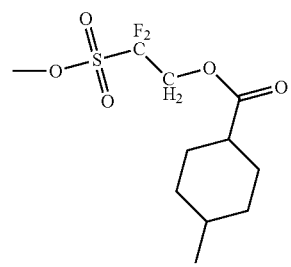

<Formula 30>

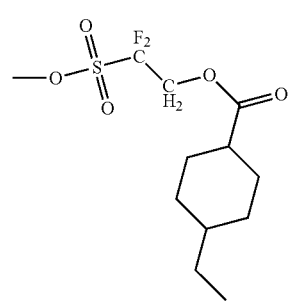

<Formula 31>

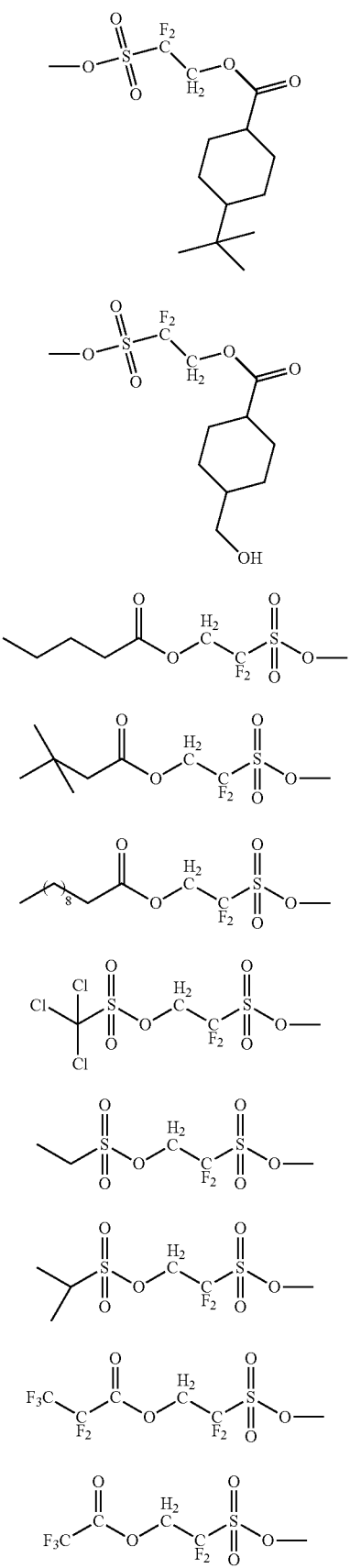
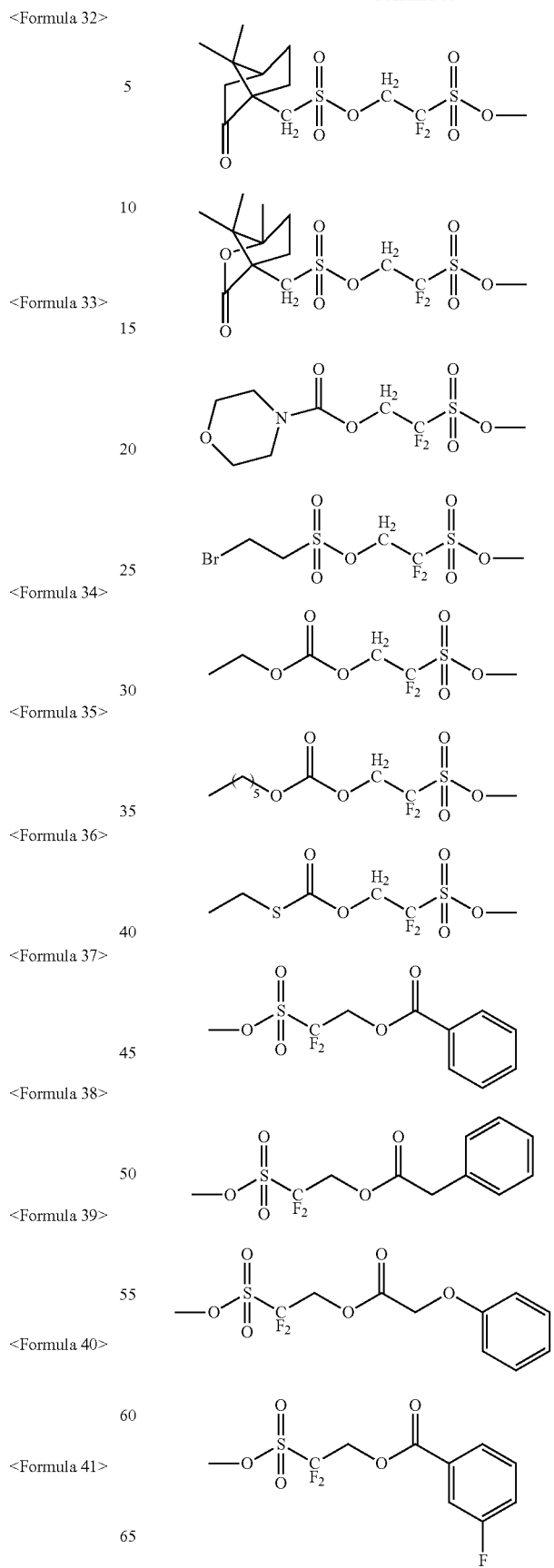

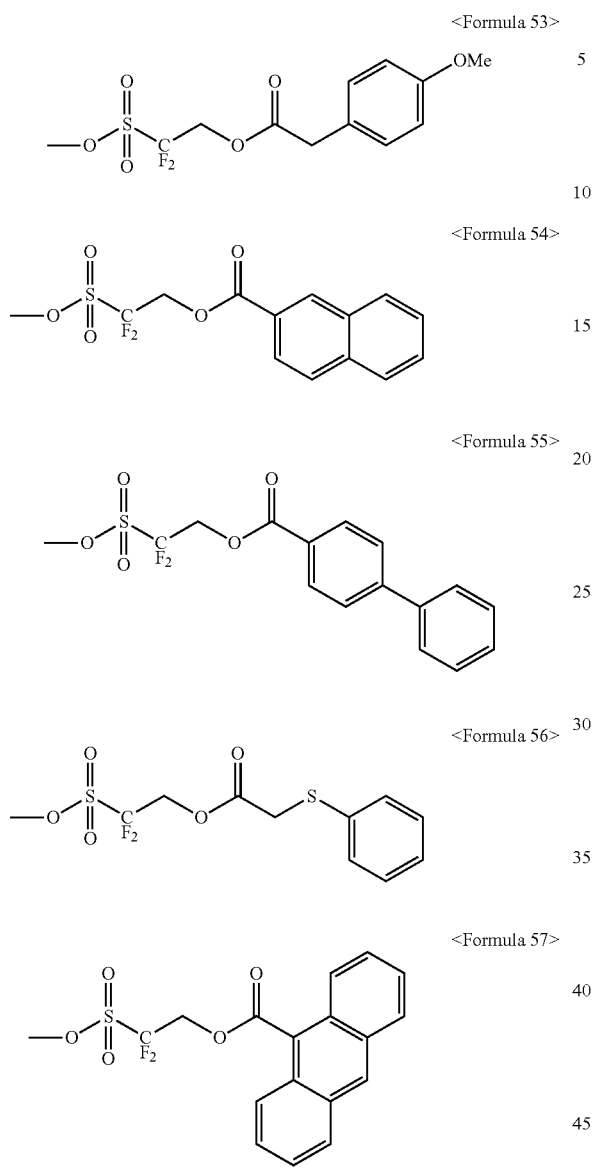
Examples of a cation in Formulae 19 and 20 include cationic compounds represented by Formulae 58 through 73:
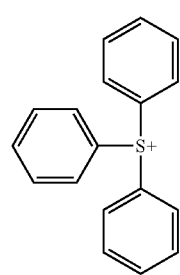
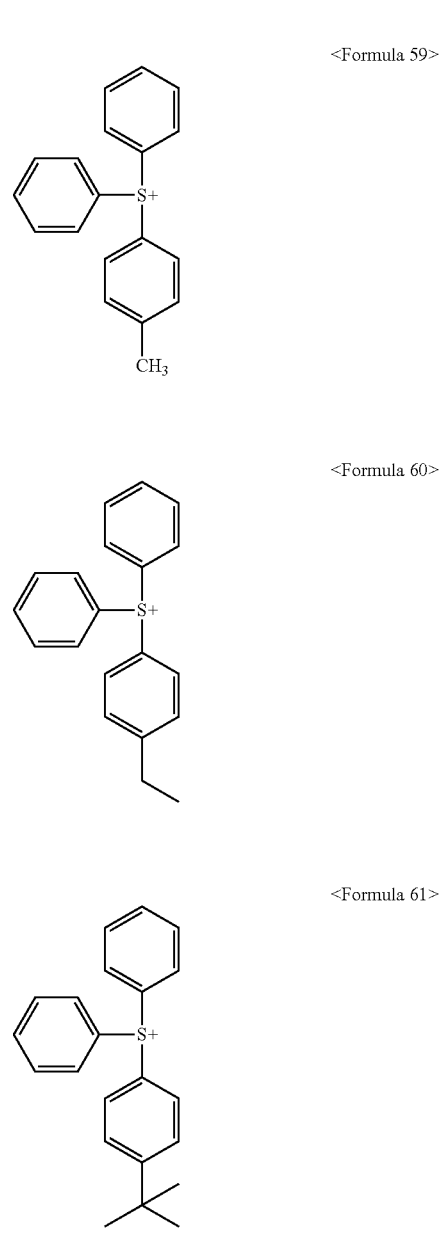

<Formula 63>
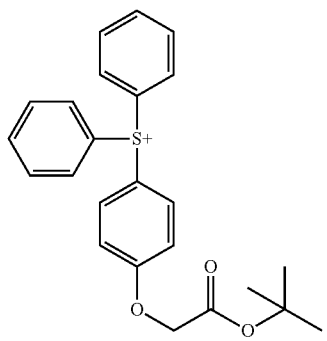
<Formula 64>
<Formula 65>
<Formula 66>
<Formula 67>
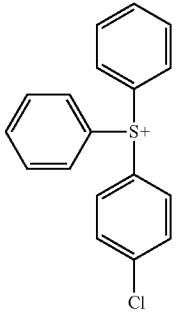
<Formula 68>
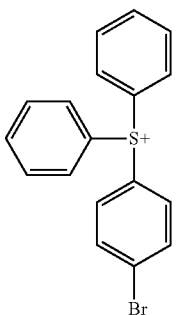
<Formula 69>
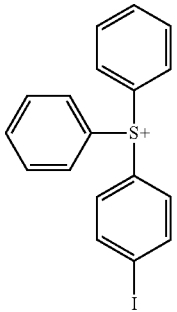
<Formula 70>
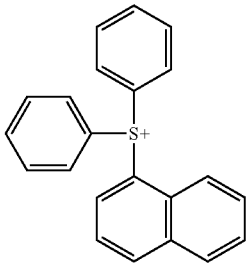
<Formula 71>
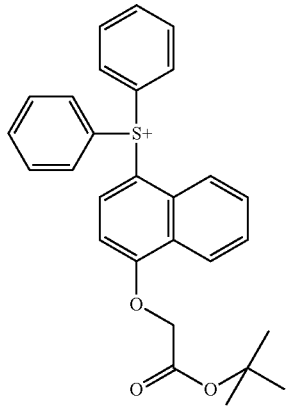

-continued

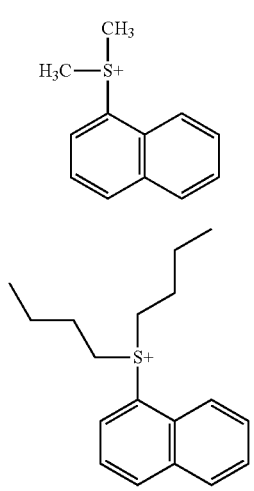

<Formula 72>

<Formula 73>

The amount of the photoacid generator may be in the range of 0.5 to 15 parts by weight, for example, in the range of 2 to 10 parts by weight based on 100 parts by weight of copolymer solids. If the amount of the photoacid generator is greater than 15 parts by weight based on 100 parts by weight of copolymer solids, the verticality of a pattern significantly decreases. On the other hand, the amount of the photoacid generator is less than 2 parts by weight based on 100 parts by weight of copolymer solids, the flexibility of a pattern deteriorates. The photoacid generator may be used alone or in combination of at least two materials.

To uniformly and smoothly coat a resist resin composition according to an embodiment of the present invention, the resist resin composition dissolved in a solvent having an appropriate evaporation rate and viscosity may be used. Examples of the solvent with these physical properties include ethylene glycol monomethyl ether, ethylene glycol monoethyl ether, ethylene glycol monopropyl ether, methyl cellosolve acetate, ethyl cellosolve acetate, propylene glycol monomethyl ether acetate, propylene glycol monoethyl ether acetate, propylene glycol monopropyl ether acetate, methyl isopropyl ketone, cyclohexanone, methyl 2-hydroxypropionate, ethyl 2-hydroxypropionate, 2-heptanone, ethyl lactate, and γ-butyrolactone. These solvents may be used alone or in combination of at least two of these materials. The amount of the solvent may be appropriately adjusted according to physical properties of the solvent, for example, volatility, viscosity, and the like in order that a coating film is uniformly formed on a wafer.

The resist resin composition is prepared in the form of a solution and coated on a wafer substrate, and the resultant structure is dried to form a resist film. In this regard, the coating method may be performed such that a resist solution is prepared, and the prepared resist solution is filtered and then coated on a substrate by spin coating, flown coating, or roll coating.

A radiation is required to be partially irradiated on the coated resist film in order to form a fine pattern in a cured form. Examples of the radiation include, but are not limited to, ultraviolet rays such as I-rays, far ultraviolet rays such as a KrF excimer laser and an ArF excimer laser, an F2 excimer laser, X-rays, charged particle rays such as electron beams, and the radiation may be selectively used according to the type of the photoacid generator.

A developing solution may be selectively used from an aqueous solution containing sodium hydroxide, potassium hydroxide, sodium carbonate, sodium silicate, sodium methane silicate, ammonium hydroxide, ethylamine, n-propylamine, triethylamine, tetramethyl ammonium hydroxide, or tetraethyl ammonium hydroxide. In particular, the developing solution may be tetramethyl ammonium hydroxide. If needed, a surfactant, water-soluble alcohols, and the like may be used as an additive.

One or more embodiments of a copolymer for resist and a resist resin composition will now be described more fully with reference to the following examples. However, these examples are provided only for illustrative purposes and are not intended to limit the scope of the present invention.

EXAMPLE

Example 1

Synthesis of Copolymer 1

9.04 g of norbornene as a monomer for polymerization, 3.28 g of dimethyl azobisisobutylrate as a polymerization initiator, and 101 g of 1,4-dioxane were added to a flask and dissolved therein. The inside of flask was substituted with nitrogen gas and the internal temperature of a reactor was then raised to 70° C. When the internal temperature was raised up to 70° C., a solution obtained by dissolving 5 g of 2-methylacrylic acid 1-bicyclo[2.2.1]hept-5-en-2-yl-2-tert-butoxycarbonyl-ethoxycarbonylmethyl ester, 21.60 g of isopropyl adamantane methacrylate, 13.99 g of γ-butyrolactyl methacrylate, and 18.28 g of norbornane carbolactone methacrylate in 101 g of 1,4-dioxane was slowly added to the flask by using a syringe pump for 2 hours. After the resultant solution was maintained at 70° C. for 5 hours to induce a reaction therein, the reaction solution after a polymerization process was terminated was cooled to room temperature. The cooled reaction solution was precipitated with an excess amount of n-hexane and then filtered. In the filtering process, the reaction solution was washed with the same solvent and then dried under reduced pressure to obtain 53 g of a copolymer represented by Formula 6 below. A weight average molecular weight ("Mw") of the copolymer with respect to polystyrene standard was 9,100, and a ratio of Mw to number average molecular weight (Mn) (Mw/Mn) was 1.92:1.

<Formula 6>

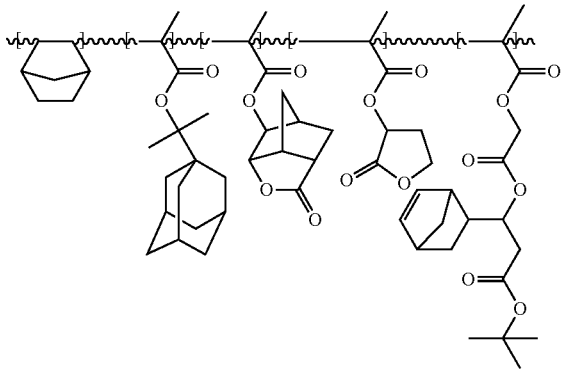

Example 2

Synthesis of Copolymer 2

7.75 g of norbornene as a monomer for polymerization, 5.12 g of dimethyl azobisisobutylrate as a polymerization initiator, and 110 g of 1,4-dioxane were added to a flask and dissolved therein. The inside of flask was substituted with nitrogen gas and the internal temperature of a reactor was then raised to 70° C. When the internal temperature was raised up to 70° C., a solution obtained by dissolving 32.15 g of 2-methyl-acrylic acid 1-bicyclo[2.2.1]hept-5-en-2-yl-2-tert-butoxycarbonyl-ethoxycarbonylmethyl ester, 24.37 g of norbornane carbolactone methacrylate, and 6.10 g of hydroxy adamantane methacrylate in 110 g of 1,4-dioxane was slowly added to the flask by using a syringe pump for 2 hours. After the resultant solution was maintained at 70° C. for 5 hours to induce a reaction therein, the reaction solution after a polymerization process was terminated was cooled to room temperature. The cooled reaction solution was precipitated with an excess amount of n-hexane and then filtered. In the filtering process, the reaction solution was washed with the same solvent and then dried under reduced pressure to obtain 51 g of a copolymer represented by Formula 7 below. An Mw of the copolymer with respect to polystyrene standard was 6,320, and a ratio of Mw to Mn (Mw/Mn) was 1.62:1.

azobisisobutylrate as a polymerization initiator, and 55 g of 1,4-dioxane were added to a flask and dissolved therein. The inside of flask was substituted with nitrogen gas and the internal temperature of a reactor was then raised to 70° C. When the internal temperature was raised up to 70° C., a solution obtained by dissolving 5 g of 2-methyl-acrylic acid 1-bicyclo[2.2.1]hept-5-en-2-yl-2-tert-butoxycarbonyl-ethoxycarbonylmethyl ester, 19.44 g of hydroxy adamantane methacrylate, 14 g of γ-butyrolactyl methacrylate, and 6.43 g of methyl adamantane methacylate in 55 g of 1,4-dioxane was slowly added to the flask by using a syringe pump for 2 hours. After the resultant solution was maintained at 70° C. for 5 hours to induce a reaction therein, the reaction solution after a polymerization process was terminated was cooled to room temperature. The cooled reaction solution was precipitated

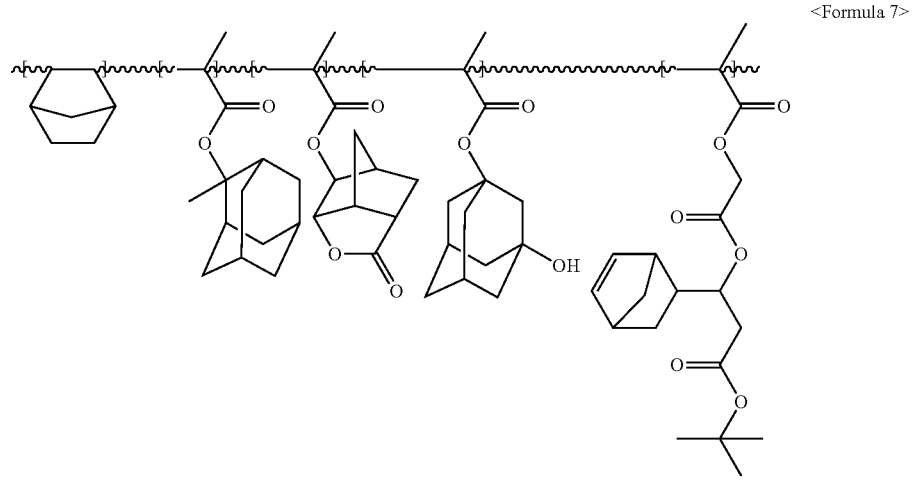

<Formula 7>

Example 3

Synthesis of Copolymer 3

9.04 g of norbornene as a monomer for polymerization, 18 g of isopropyl adamantane methacrylate, 5.12 g of dimethyl with an excess amount of n-hexane and then filtered. In the filtering process, the reaction solution was washed with the same solvent and then dried under reduced pressure to obtain 35 g of a copolymer represented by Formula 9 below. An Mw of the copolymer with respect to polystyrene standard was 5,938, and a ratio of Mw to Mn (Mw/Mn) was 1.66:1.

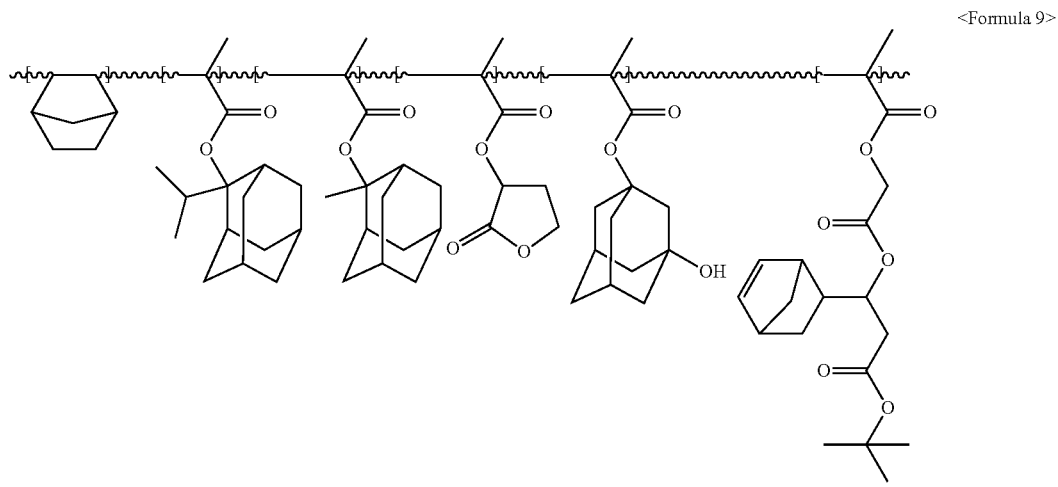

<Formula 9>

Example 4

Synthesis of Copolymer 4

3.63 g of dimethyl azobisisobutylrate as a polymerization initiator and 110 g of 1,4-dioxane were added to a flask and dissolved therein. The inside of flask was substituted with nitrogen gas and the internal temperature of a reactor was then raised to 70° C. When the internal temperature was raised up to 70° C., a solution obtained by dissolving 5 g of 2-methyl-acrylic acid 1-bicyclo[2.2.1]hept-5-en-2-yl-2-tert-butoxycarbonyl-ethoxycarbonylmethyl ester, 18 g of isopropyl adamantane methacrylate, 16.3 g of methyl adamantane methacrylate, 14 g of γ-butyrolactyl methacrylate, and 19 g of hydroxyl adamantane methacylate in 110 g of 1,4-dioxane was slowly added to the flask by using a syringe pump for 2 hours. After the resultant solution was maintained at 70° C. for 5 hours to induce a reaction therein, the reaction solution after a polymerization process was terminated was cooled to room temperature. The cooled reaction solution was precipitated with an excess amount of n-hexane and then filtered. In the filtering process, the reaction solution was washed with the same solvent and then dried under reduced pressure to obtain 51 g of a copolymer represented by Formula 12 below. An Mw of the copolymer with respect to polystyrene standard was 6,978, and a ratio of Mw to Mn (Mw/Mn) was 1.71:1.

Example 5

Synthesis of Copolymer 5

7.7 g of norbornene as a monomer for polymerization, 4.1 g of dimethyl azobisisobutylrate as a polymerization initiator, and 110 g of 1,4-dioxane were added to a flask and dissolved therein. The inside of flask was substituted with nitrogen gas and the internal temperature of a reactor was then raised to 70° C. When the internal temperature was raised up to 70° C., a solution obtained by dissolving 5 g of 2-methyl-acrylic acid 1-bicyclo[2.2.1]hept-5-en-2-yl-2-tert-butoxycarbonyl-ethoxycarbonylmethyl ester, 5 g of 2-ethyl cyclopentyl methacylate, 16 g of methyl adamantane methacrylate, 18 g of norbornane carbolactone methacrylate, and 19 g of hydroxy adamantane methacylate in 110 g of 1,4-dioxane was slowly added to the flask by using a syringe pump for 2 hours. After the resultant solution was maintained at 70° C. for 5 hours to induce a reaction therein, the reaction solution after a polymerization process was terminated was cooled to room temperature. The cooled reaction solution was precipitated with an excess amount of n-hexane and then filtered. In the filtering process, the reaction solution was washed with the same solvent and then dried under reduced pressure to obtain 59 g of a copolymer represented by Formula 13 below. An Mw of the copolymer with respect to polystyrene standard was 6,252, and a ratio of Mw to Mn (Mw/Mn) was 1.82:1.

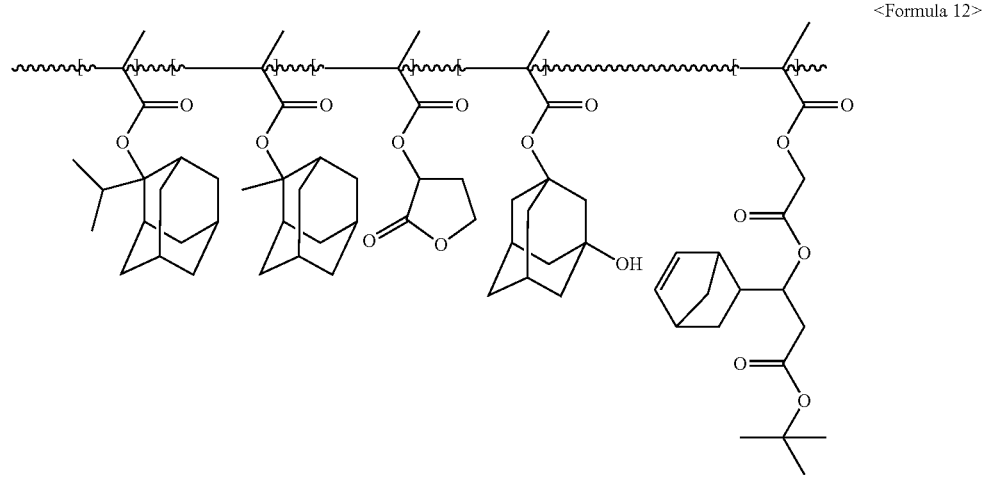

<Formula 12>

<Formula 13>

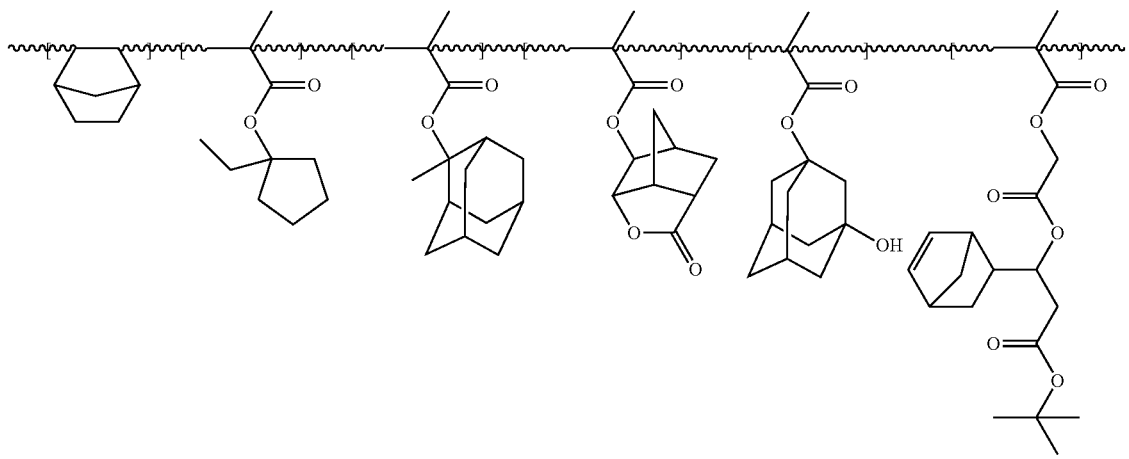

Preparation of Resist and Evaluation

Example 6

4 parts by weight of triphenylsulfonium nonaflate as a photoacid generator and 0.2 parts by weight of tetramethyl ammonium hydroxide as a basic additive based on 100 parts by weight of the copolymer of Formula 6 prepared according to Example 1, were dissolved in 1,000 parts by weight of propylene glycol methyl ether acetate and the mixed solution was then filtered using a membrane filter of 0.2 μm to prepare a resist solution.

The resist solution was coated on a substrate by using a spinner and the coated substrate was dried at 110° C. for 90 seconds to form a film having a thickness of 0.2 μm. The film was exposed to light by using an ArF excimer laser stepper (lens numerical aperture: 0.78), and then subjected to heat treatment at 110° C. for 90 seconds. Subsequently, the film was developed for about 40 seconds using 2.38 wt % of a tetramethyl ammonium hydroxide aqueous solution, cleansed, and dried, thereby forming a resist pattern.

Developing property of the tetramethyl ammonium hydroxide aqueous solution and adhesive property of the formed resist pattern with respect to the substrate were excellent, and a resolution of the formed resist pattern was 0.09 μm and the sensitivity thereof was about 15 mJ/cm². In a case of the adhesive property, an adhesion state of a Line and Space (L/S) pattern of 0.09 μm formed after the developing process was observed. Also, in a case of the sensitivity, an exposure forming the LIS pattern of 0.09 μm formed after the developing process to be a pattern with a line width of 1:1 was represented as an optimum exposure, the optimum exposure was represented as the sensitivity, and the developed minimum pattern size was represented as a resolution.

Examples 7 through 15

The same photoacid generator and basic additive as those used in Example 6 were used in amounts shown in Table 1 below based on 100 parts by weight of each of the copolymers prepared according to Examples 2 through 4 (Formulae 7, 9, and 12, respectively), which were dissolved in 1,000 parts by weight of propylene glycol methyl ether acetate. Then, the mixed solution was filtered using a membrane filter of 0.2 μm to prepare a resist composition (amount: wt %) and a positive resist pattern was the formed in the same manner as in Example 5 by using the resist composition. The positive resist pattern was evaluated, and the results are shown in Table 1 below.

TABLE 1

| | Resin (wt %) | *PAG (wt %) | *Base (wt %) | sensitivity (mJ/cm2) | resolution (nm) |
| --- | --- | --- | --- | --- | --- |
| Example 7 | Formula 7(100) | 4 | 0.2 | 15 | 90 |
| Example 8 | Formula 9(100) | 4 | 0.2 | 15 | 80 |
| Example 9 | Formula 12(100) | 4 | 0.2 | 15 | 100 |
| Example 10 | Formula 7(100) | 5 | 0.2 | 13 | 90 |
| Example 11 | Formula 9(100) | 5 | 0.2 | 13 | 80 |
| Example 12 | Formula 12(100) | 5 | 0.2 | 12 | 80 |
| Example 13 | Formula 7(100) | 5 | 0.3 | 16 | 100 |
| Example 14 | Formula 9(100) | 5 | 0.3 | 16 | 90 |
| Example 15 | Formula 12(100) | 5 | 0.3 | 15 | 100 |

*PAG: triphenylsulfonium nonaflate,
*Base: tetramethylammonium hydroxide

Comparative Examples 1 through 3

A COMA resin represented by Formula 74 below (commercially available from Korea Kumho Petrochemical Co., Ltd.), an acid generator, and a basic additive were dissolved in 1,000 parts by weight of propylene glycol methyl ether acetate, and the mixed solution was filtered using a membrane filter of 0.2 μm to prepare a resist composition (amount: parts by weight (wt %)). A positive resist pattern was formed in the same manner as in Example 5, except that each of the resist compositions was exposed to light using an ArF excimer laser (lens numerical aperture: 0.78) and the resin of Formula 74 were used. The positive resist pattern was evaluated, and the results are shown in Table 2 below.

TABLE 2

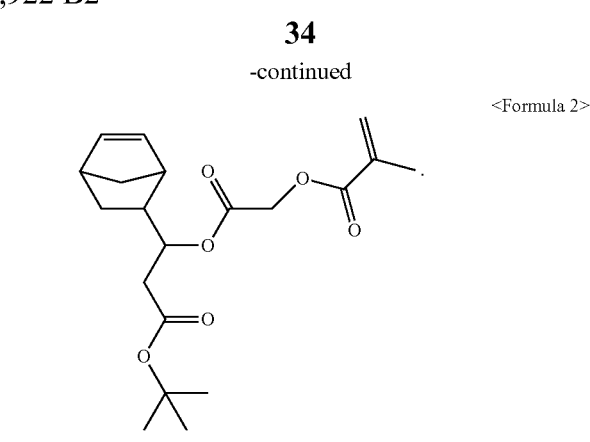
<Formula 74>

|  | Resin (wt %) | PAG (wt %) | Base (wt %) | Sensitivity (mJ/cm2) | Resolution (um) |
|---|---|---|---|---|---|
| Comparative Example 1 | Formula 74 (100) | 2.5 | 0.02 | 15 | 120 |
| Comparative Example 2 | Formula 74 (100) | 3.0 | 0.02 | 14 | 110 |
| Comparative Example 3 | Formula 74 (100) | 3.0 | 0.03 | 16.5 | 120 |

As described above, according to the one or more embodiments of the present invention, a copolymer for resist is synthesized by introducing an acetyl group used to increase the number of carbon atoms into a norbornene derivative having t-buthoxy carbonyl that increases an etching resistance and then using novel acryl monomers formed by a reaction with methacrylchloride, wherein a line edge roughness in immersion lithography using an ArF excimer laser may be improved.

In addition, a bond between t-butoxy carbonyl groups is broken by acid generated when the copolymer is irradiated by an ArF excimer laser, and thus the mobility and diffusion of acid are increased. Therefore, the copolymer may have high resolution, excellent developing properties by using a developing solution, and increased adhesion strength with a substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A copolymer for a resist, comprising as repeating units a norbornene derivative and at least one of the acryl-based monomers represented by Formulae 1 and 2 below:

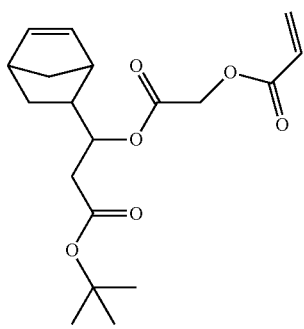
<Formula 1>

<Formula 2>

2. A resist resin composition comprising:

100 parts by weight of a copolymer represented by Formula 3 below;

0.5 to 1.5 parts by weight of a photoacid generator and 700 to 1,500 parts by weight of a solvent:

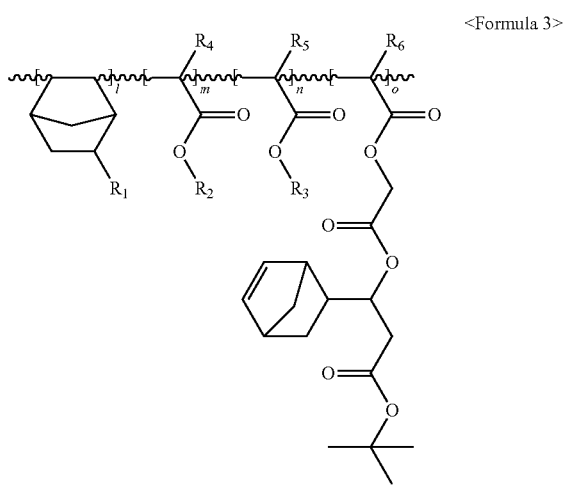
<Formula 3> wherein $R_1$, $R_2$, and $R_3$ are each independently a $C_{1-30}$ alkyl group, a $C_{3-30}$ cycloalkyl group, an ether group, an ester group, a carbonyl group, an acetal group, an epoxy group, a nitrile group, or an aldehyde group, $R_4$, $R_5$, and $R_6$ are each independently hydrogen or a methyl group, and l, m, n, and o each independently refer to the number of repeating units in a main backbone and satisfy the conditions: $l+m+n+o=1$, $0 \le l/(l+m+n+o) < 0.4$, $0 < m/(l+m+n+o) < 0.6$, $0 \le n/(l+m+n+o) < 0.6$, and $0 < o/(l+m+n+o) < 0.4$.

3. The resist resin composition of claim 2, wherein a weight average molecular weight (Mw) of the copolymer with respect to polystyrene standard by gel permeation chromatography (GPC) is in a range of 2,000 to 1,000,000.

4. The resist resin composition of claim 2, wherein a molecular weight distribution represented by weight average molecular weight/number average molecular weight of the copolymer is in a range of 1.0 to 5.0.

5. The resist resin composition of claim 2, wherein repeating units "m" and "n" in Formula 3 comprise an acid-labile functional group.

6. The resist resin composition of claim 2, wherein repeating units "m" and "n" in Formula 3 comprise a lactone-containing functional group.

7. The resist resin composition of claim 2, wherein the photoacid generator is a salt compound represented by Formula 19 or 20 below:

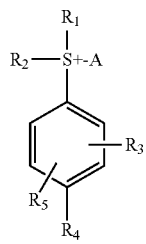

<Formula 19>

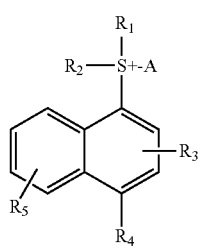

<Formula 20> wherein $R_1$ and $R_2$ are each independently an alkyl group, an allyl group, a perfluoroalkyl group, a benzyl group, or an aryl group, $R_3$, $R_4$, and $R_5$ are each independently hydrogen, an alkyl group, a halogen group, a alkoxy group, an aryl group, a thiophenoxy group, a thioalkoxy group, or an alkoxycarbonylmethoxy group, and "A" that denotes an anion is $OSO_2CF_3$, $OSO_2C_4F_9$, $OSO_2C_5F_{17}$, $N(CF_3)_2$, $N(C_2F_5)_2$, $N(C_4F_9)_2$, $C(CF_3)_3$, $C(C_2F_5)_3$, $C(C_4F_9)_3$, or a compound represented by Formula 21 below:

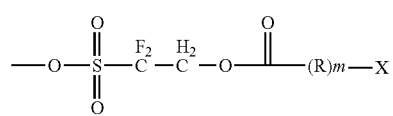

<Formula 21> wherein X refers to a monocyclic or polycyclic $C_3$-$C_{30}$ hydrocarbon group, a benzyl group, or an aryl group; a $C_1$-$C_{20}$ alkyl group, an allyl group, a perfluoroalkyl group, alkyl, haloalkyl, or an alkylsulfonyl group, wherein the alkyl group is substituted with a hydrogen group, an ether group, an ester group, a carbonyl group, an acetal group, a nitrile group, a cyano group, a hydroxy group, a carboxyl group, or an aldehyde group; or $C_1$-$C_4$ perfluoroalkyl group, R is a $C_1$-$C_{10}$ alkyl group, a $C_1$-$C_{10}$ alkoxy group, or a hetero atom selected from N, S, F, and O, and m is an integer of 0 to 2.

8. A photoresist film formed by coating and curing the resist resin composition of claim 2.

9. The photoresist film of claim 8, wherein a developing process is performed using an aqueous solution containing tetramethyl ammonium hydroxide.

10. The resist resin composition of claim 2, wherein the solvent is selected from the group consisting of ethylene glycol monomethyl ether, ethylene glycol monoethyl ether, ethylene glycol monopropyl ether, methyl cellosolve acetate, ethyl cellosolve acetate, propylene glycol monomethyl ether acetate, propylene glycol monoethyl ether acetate, propylene glycol monopropyl ether acetate, methyl isopropyl ketone, cyclohexanone, methyl 2-hydroxypropionate, ethyl 2-hydroxypropionate, 2-heptanone, ethyl lactate, γ-butyrolactone, and combinations thereof.

11. A resist resin composition comprising:
100 parts by weight of a copolymer selected from the group consisting of Formula 6, Formula 7, Formula 9, Formula 12, and Formula 13 as shown below;
0.5 to 1.5 parts by weight of a photoacid generator and
700 to 1,500 parts by weight of a solvent:

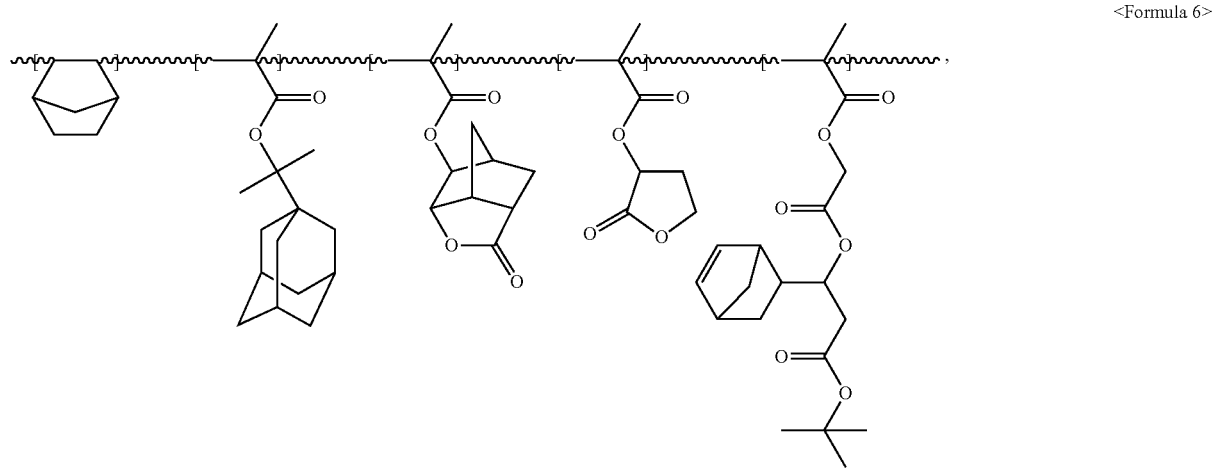

<Formula 6>

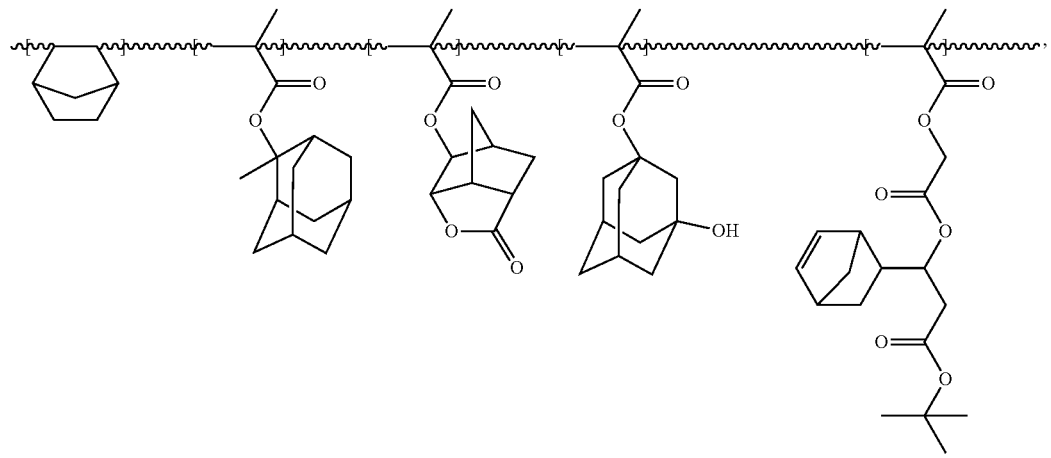
<Formula 7>
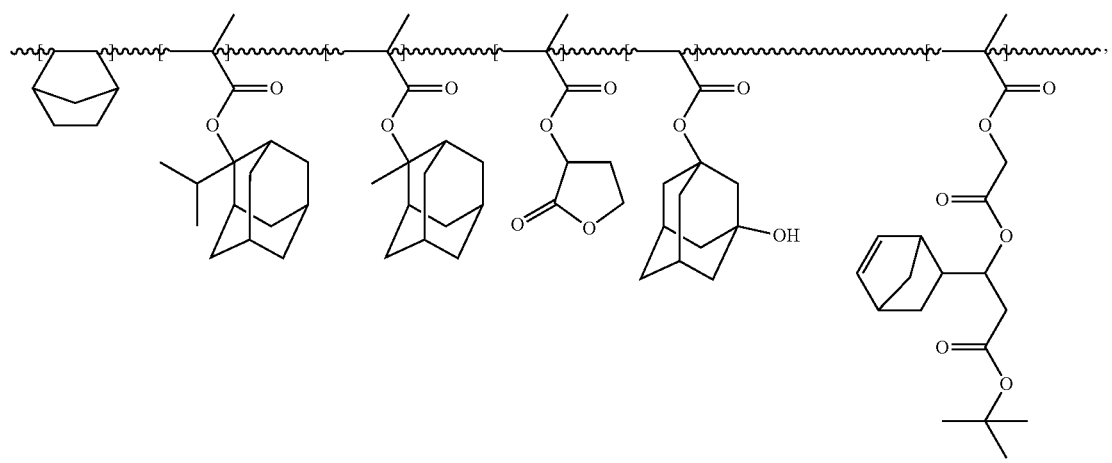
<Formula 9>
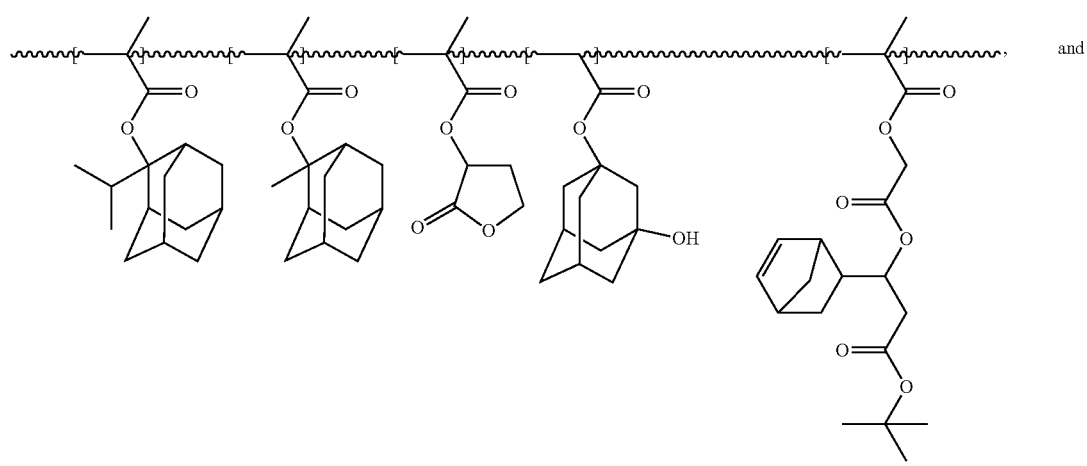
<Formula 12> and

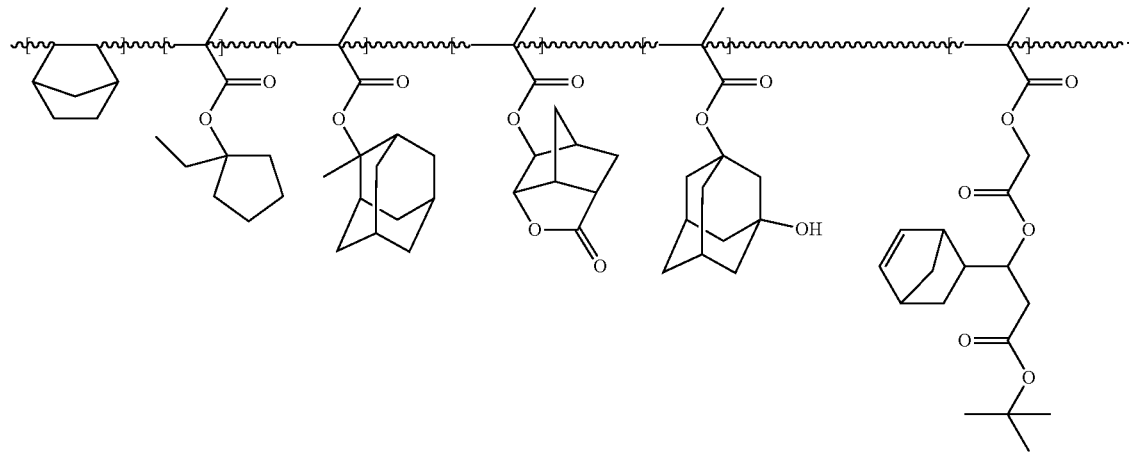

<Formula 13>

12. The resist resin of claim 11, wherein the solvent is selected from the group consisting of ethylene glycol monomethyl ether, ethylene glycol monoethyl ether, ethylene glycol monopropyl ether, methyl cellosolve acetate, ethyl cellosolve acetate, propylene glycol monomethyl ether acetate, propylene glycol monoethyl ether acetate, propylene glycol monopropyl ether acetate, methyl isopropyl ketone, cyclohexanone, methyl 2-hydroxypropionate, ethyl 2-hydroxypropionate, 2-heptanone, ethyl lactate, γ-butyrolactone, and combinations thereof.

13. The resist resin composition of claim 11, wherein the photoacid generator is a salt compound represented by Formula 19 or 20 below:

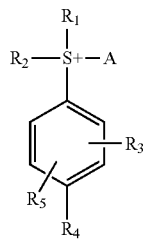

<Formula 19>

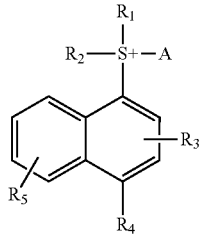

<Formula 20> wherein $R_1$ and $R_2$ are each independently an alkyl group, an allyl group, a perfluoroalkyl group, a benzyl group, or an aryl group, $R_3$, $R_4$, and $R_5$ are each independently hydrogen, an alkyl group, a halogen group, a alkoxy group, an aryl group, a thiophenoxy group, a thioalkoxy group, or an alkoxycarbonylmethoxy group, and "A" that denotes an anion is $OSO_2CF_3$, $OSO_2C_4F_9$, $OSO_2C_8F_{17}$, $N(CF_3)_2$, $N(C_2F_5)_2$, $N(C_4F_9)_2$, $C(CF_3)_3$, $C(C_2F_5)_3$, $C(C_4F_9)_3$, or a compound represented by Formula 21 below:

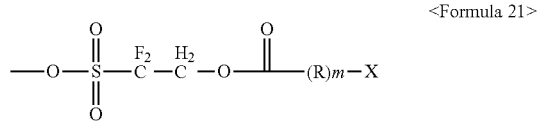

<Formula 21> wherein X refers to a monocyclic or polycyclic $C_3$-$C_{30}$ hydrocarbon group, a benzyl group, or an aryl group; a $C_1$-$C_{20}$ alkyl group, an allyl group, a perfluoroalkyl group, alkyl, haloalkyl, or an alkylsulfonyl group, wherein the alkyl group is substituted with a hydrogen group, an ether group, an ester group, a carbonyl group, an acetal group, a nitrile group, a cyano group, a hydroxy group, a carboxyl group, or an aldehyde group; or $C_1$-$C_4$ perfluoroalkyl group, R is a $C_1$-$C_{10}$ alkyl group, a $C_1$-$C_{10}$ alkoxy group, or a hetero atom selected from N, S, F, and O, and m is an integer of 0 to 2.

14. The resist resin composition of claim 11, wherein the copolymer is represented by Formula 6.

15. The resist resin composition of claim 11, wherein the copolymer is represented by Formula 7.

16. The resist resin composition of claim 11, wherein the copolymer is represented by Formula 9.

17. The resist resin composition of claim 11, wherein the copolymer is represented by Formula 12.

18. The resist resin composition of claim 11, wherein the copolymer is represented by Formula 13.

* * * * *